United States Patent [19]

Masaki

[11] Patent Number: 4,739,195
[45] Date of Patent: Apr. 19, 1988

[54] MOSFET CIRCUIT FOR EXCLUSIVE CONTROL

[75] Inventor: Yoshifumi Masaki, Nara, Japan

[73] Assignee: Sharp Kabushiki Kaisha, Osaka, Japan

[21] Appl. No.: 28,068

[22] Filed: Mar. 19, 1987

Related U.S. Application Data

[63] Continuation of Ser. No. 710,465, Mar. 11, 1985, abandoned.

[30] Foreign Application Priority Data

Feb. 21, 1984 [JP] Japan .................................. 59-54774

[51] Int. Cl.⁴ ..................... H03K 19/21; H03K 19/094
[52] U.S. Cl. .................................... 307/471; 307/448; 307/451; 307/243
[58] Field of Search ................ 307/443, 448, 451–453, 307/471, 241, 243, 584, 585; 364/738

[56] References Cited

U.S. PATENT DOCUMENTS

| | | | |
|---|---|---|---|
| 4,006,365 | 2/1977 | Marzin et al. | 307/471 |
| 4,049,974 | 9/1977 | Boone et al. | 307/471 X |
| 4,074,150 | 2/1978 | Buckley, III et al. | 307/443 X |
| 4,356,413 | 10/1982 | Rosenbluth et al. | 307/443 |
| 4,541,067 | 9/1985 | Whitaker | 307/471 X |
| 4,575,648 | 3/1986 | Lee | 307/451 X |

OTHER PUBLICATIONS

Griffin et al., "CMOS Four-Way XOR Circuit", IBM TDB, vol. 25, No. 11B, Apr. 1983, pp. 6066–6067.
Griffin et al., "Three-Way Exlcusive-OR Circuit", vol. 25, No. 11B, Apr. 1983, pp. 6062–6063.

*Primary Examiner*—Stanley D. Miller
*Assistant Examiner*—D. R. Hudspeth
*Attorney, Agent, or Firm*—Flehr, Hohbach, Test, Albritton & Herbert

[57] ABSTRACT

A circuit with an extremely small number of MOSFETs has a set of signals and their negatives as gate inputs to these MOSFETs which are serially connected into four rows. MOSFETs in different rows are interconected so as to produce the EXCLUSIVE-OR and the NOT-EXCLUSIVE-OR of these input signals.

3 Claims, 1 Drawing Sheet

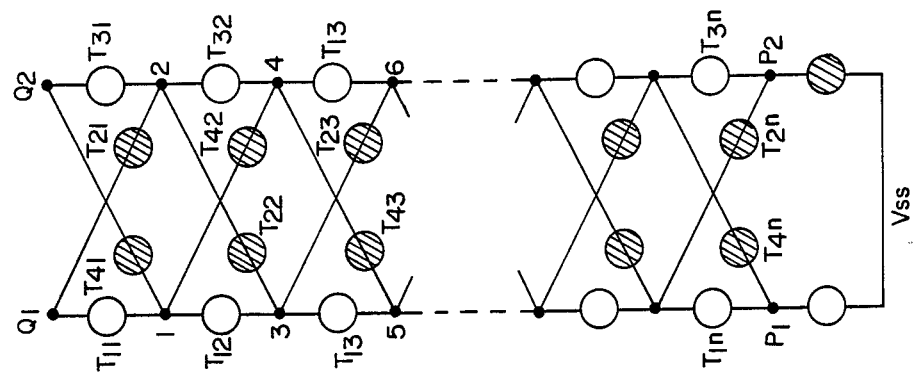
FIG.—3
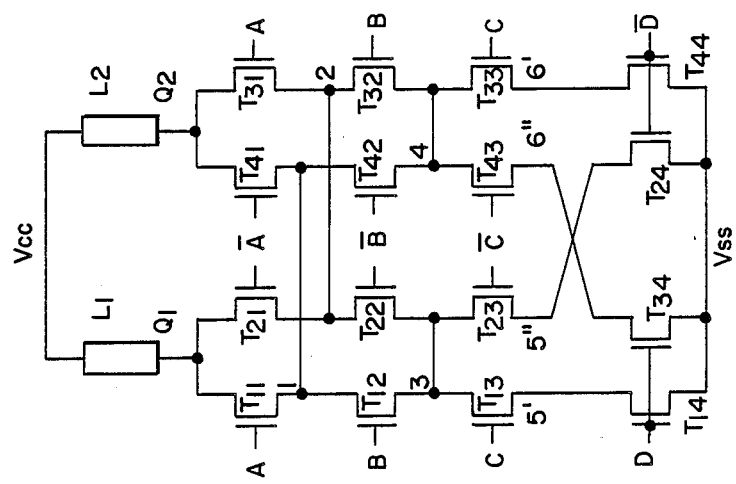
FIG.—2
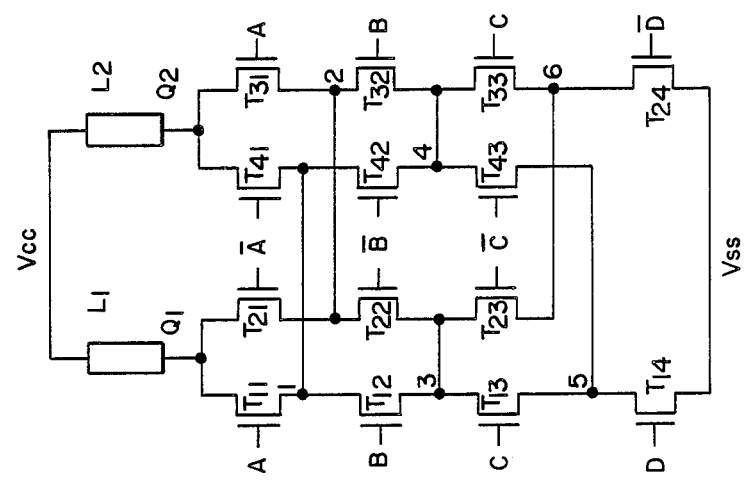
FIG.—1

MOSFET CIRCUIT FOR EXCLUSIVE CONTROL

This application is a continuation of application Ser. No. 710,465 filed Mar. 11, 1985, now abandoned.

This invention relates to a MOSFET circuit for outputting the EXCLUSIVE-OR of a multiple input signal and its negation, NOT-EXCLUSIVE-OR.

There are situations where it is necessary to output the EXCLUSIVE-OR of a multiple input signal and its negation. A conventional method of outputting the EXCLUSIVE-OR of a multiple input signal was to repeat many times the operation for the case of two inputs. The principal disadvantage of this method, however, is that it takes a long time to obtain the output because EXCLUSIVE-OR must be calculated many times over in units of two inputs. As for the problem of outputting both the EXCLUSIVE-OR and its negation, the conventional method was to make use of a separate NOT circuit. with a circuit of such a design, however, operation time is usually different for the output of EXCLUSIVE-OR and its negation. Moreover, since they are always in a negative relationship with respect to each other, such circuits are difficult to design.

There is still another design according to which two identical circuits are used for this purpose such that the polarity of an input of one of the circuits is reversed. Such a design, however, has the disadvantage of requiring too many elements to construct the circuit.

It is therefore an object of the present invention to solve all of the aforementioned problems, or to provide a MOSFET circuit with a small number of constituent elements which can speedily and simultaneously generate an EXCLUSIVE-OR output and its negation.

It is another object of the present invention to provide such a MOSFET circuit as mentioned above which can be applied immediately to a dynamic circuit by using as a load element a MOSFET with a clock signal inputted to its gate.

FIG. 1 is a circuit diagram embodying the present invention.

FIG. 2 is another circuit diagram according to the present invention.

FIG. 3 is a model diagram which generally represents the present invention.

FIG. 1 is an embodiment of the present invention for a situation where the number of input signals and that of their negative input signals are "4". There are four sets of serially connected MOSFET rows corresponding to four input signals A, B, C and D and four negative input signals $\overline{A}$, $\overline{B}$, $\overline{C}$ and $\overline{D}$ and there are at least three MOSFETs connected in series in each of the four MOSFET rows. MOSFETs $T_{11}$, $T_{12}$ and $T_{13}$, to the gate of which the input signals A, B and C are respectively inputted, form a first MOSFET row while MOSFETs $T_{21}$, $T_{22}$ and $T_{23}$, to the gates of which the negative input signals $\overline{A}$, $\overline{B}$ and $\overline{C}$ are respectively inputted, form a second MOSFET row. MOSFETS $T_{11}$ and $T_{21}$ are connected together to form a first output point $Q_1$ and there is a first load $L_1$ inserted between this output point $Q_1$ and a power source $V_{CC}$. Similarly, MOSFETs $T_{31}$, $T_{32}$ and $T_{33}$, to the gates of which the input signals A, B and C are respectively inputted, form a third MOSFET row while MOSFETs $T_{41}$, $T_{42}$ and $T_{34}$, to the gates of which the negative input signals $\overline{A}$, $\overline{B}$ and $\overline{C}$ are respectively inputted, form a fourth MOSFET row. MOSFETs $T_{31}$ and $T_{41}$ are connected together to form a second output point $Q_2$ and there is a second load $L_2$ inserted between the second output point $Q_2$ and the power source $V_{CC}$. These four MOSFET rows are connected as follow.

Firstly, the side of MOSFET $T_{11}$ distal to the first output point $Q_1$ and the side of MOSFET $T_{41}$ distal to the second output point $Q_2$ are connected together as node 1. Similarly, the sides of MOSFETs $T_{21}$ and $T_{31}$ distal respectively to the first and second output points $Q_1$ and $Q_2$ are connected together as node 2. Viewed from the direction of output points $Q_1$ and $Q_2$, therefore, connections are made on the other sides of MOSFETs having mutually different gate inputs. Secondly, the distal sides of two MOSFETs to which mutually different input signals B and $\overline{B}$ are inputted ($T_{12}$ with $T_{22}$ and $T_{32}$ with $T_{42}$) as seen from the output points $Q_1$ and $Q_2$ are connected together to form node 3 and node 4, respectively. Thirdly, the distal sides of two MOSFETs to which mutually different input signals C and $\overline{C}$ are inputted ($T_{13}$ with $T_{43}$ and $T_{23}$ with $T_{32}$) as seen from the output points $Q_1$ and $Q_2$ are connected together to form node 5 and node 6, respectively. Node 5 is further connected to a MOSFET $T_{14}$, to the gate of which the input signal D is applied while node 6 is connected to a MOSFET $T_{24}$, to the gate of which the input signal $\overline{D}$ is applied. These MOSFETs $T_{14}$ and $T_{24}$ are together connected to another power source $V_{SS}$.

As a variation on the circuit of FIG. 1, MOSFETs $T_{14}$, $T_{24}$, $T_{44}$ and $T_{34}$ may be provided each to the four MOSFET rows as shown in FIG. 2, the input signal D being applied to the gates of MOSFETs $T_{14}$ and $T_{44}$, the input signal $\overline{D}$ being applied to the gates of MOSFETs $T_{24}$ and $T_{34}$ and the distal sides of MOSFETs $T_{14}$, $T_{24}$, $T_{44}$ and $T_{34}$ being connected together to the other power source $V_{SS}$.

The processes that take place for outputting EXCLUSIVE-OR and its negation are explained below with respect to the MOSFET circuit of FIG. 1. As can be seen, there are eight current paths from the first output point $Q_1$ to the power source $V_{SS}$. They can be written as follows:

(1): $Q_1 \to 1 \to 3 \to 5 \to V_{SS}$
(2): $Q_1 \to 1 \to 3 \to 6 \to V_{SS}$
(3): $Q_1 \to 1 \to 4 \to 5 \to V_{SS}$
(4): $Q_1 \to 1 \to 4 \to 6 \to V_{SS}$
(5): $Q_1 \to 2 \to 3 \to 5 \to V_{SS}$
(6): $Q_1 \to 2 \to 3 \to 6 \to V_{SS}$
(7): $Q_1 \to 2 \to 4 \to 5 \to V_{SS}$
(8): $Q_1 \to 2 \to 4 \to 6 \to V_{SS}$ where the numerals identify the nodes which define the paths. The above may be rewritten as follows in terms of the input signals to the MOSFETs which define the paths:

(1'): $A \to B \to C \to D$
(2'): $A \to B \to \overline{C} \to \overline{D}$
(3'): $A \to \overline{B} \to \overline{C} \to D$
(4'): $A \to \overline{B} \to C \to \overline{D}$
(5'): $\overline{A} \to \overline{B} \to C \to D$
(6'): $\overline{A} \to \overline{B} \to \overline{C} \to \overline{D}$
(7'): $\overline{A} \to B \to \overline{C} \to D$
(8'): $\overline{A} \to B \to C \to \overline{D}$ It is to be noted that each path passes an even number of MOSFETs having an input signal A, B, C or D inputted to the gate and also an even number of MOSFETs having a negative input signal $\overline{A}$, $\overline{B}$, $\overline{C}$ or $\overline{D}$ inputted to the gate.

As for the current from the second output point $Q_2$ to the power source $V_{SS}$, there are similarly eight different paths which are like (1) to (8) shown above except $Q_1$ is replaced by $Q_2$. In terms of the signals inputted to the MOSFETs on the paths, they may be written as (1") to (8") which are the same as (1') to (8') except A and $\overline{A}$ are interchanged. Thus, each path from the second output point $Q_2$ to the power source $V_{SS}$ similarly passes odd numbers of MOSFETs having respectively an input signal A, B, C or D and a negative input signal $\overline{A}, \overline{B}, \overline{C}$ or $\overline{D}$ inputted to the gate.

Let us assume now that the input signals A, B, C, D, $\overline{A}, \overline{B}, \overline{C}$ and $\overline{D}$ each have two different levels, one level for setting the MOSFET in ON condition and the other for setting it in OFF condition. Each of the 16 possible combinations of the input signal levels correspond to the combinations of MOSFETs along one of the aforementioned current paths (1') to (8') for output points $Q_1$ and $Q_2$. Let "1" be the level which sets the MOSFET to ON and "0" be that which sets it to OFF. Let "0" further be the level of $Q_1$ and $Q_2$ when a current path connects to the power source $V_{SS}$. Then, the following true-false table is obtained.

TABLE I

| | A | B | C | D | $Q_1$ | $Q_2$ |
|---|---|---|---|---|---|---|
| (1') | 1 | 1 | 1 | 1 | 0 | 1 |
| (2') | 1 | 1 | 0 | 0 | 0 | 1 |
| (3') | 1 | 0 | 0 | 1 | 0 | 1 |
| (4') | 1 | 0 | 1 | 0 | 0 | 1 |
| (5') | 0 | 0 | 1 | 1 | 1 | 0 |
| (6') | 0 | 0 | 0 | 0 | 0 | 1 |
| (7') | 0 | 1 | 0 | 1 | 0 | 1 |
| (8') | 0 | 1 | 1 | 0 | 0 | 1 |
| (1") | 0 | 1 | 1 | 1 | 1 | 0 |
| (2") | 0 | 1 | 0 | 0 | 1 | 0 |
| (3") | 0 | 0 | 0 | 1 | 1 | 0 |
| (4") | 0 | 0 | 1 | 0 | 1 | 0 |
| (5") | 1 | 0 | 1 | 1 | 1 | 0 |
| (6") | 1 | 0 | 0 | 0 | 1 | 0 |
| (7") | 1 | 1 | 0 | 0 | 1 | 0 |
| (8") | 1 | 1 | 1 | 0 | 1 | 0 |

In the table above, output $Q_1$ represents the EXCLUSIVE-OR of the four inputs and output $Q_2$ represents its negation. The processes that take place in the circuit of FIG. 2 will be identical and outputs $Q_1$ and $Q_2$ will be obtained.

A MOSFET circuit as described above can be constructed as follows for application in a dynamic circuit. The load elements $L_1$ and $L_2$ will each be a MOSFET having clock signals as its gate input. The initial condition "1" is established with $L_1$ and $L_2$ in ON condition and current paths form to the power source $V_{CC}$. At this moment, the total input of the signals A, B, C, D, $\overline{A}$, $\overline{B}, \overline{C}$ and $\overline{D}$ is "0" and all MOSFETs from the output points $Q_1$ and $Q_2$ to the power source $V_{SS}$ are in OFF condition, thus cutting off the path from $V_{CC}$ to $V_{SS}$. A change in the clock input shuts off $L_1$ and $L_2$. When either of the pair of input signals A and $\overline{A}$, B and $\overline{B}$, C and $\overline{C}$ or D and $\overline{D}$ changes to "1", a current path is formed between $Q_1$ or $Q_2$ and the power source $V_{SS}$. In this situation, if outputs $\overline{Q}_1$ and $\overline{Q}_2$ are passed through a NOT circuit to become $Q_1$ and $Q_2$, both input and output become "0" in the initial condition. This establishes a method of using the outputs $Q_1$ and $Q_2$ of this circuit as the inputs for the next stage of this circuit. The number of inputs can thus be increased easily.

An example with four inputs was explained above. FIG. 3 will be used now to explain a general case with n inputs.

In FIG. 3, a white circle represents a MOSFET with gate input $A_i$ and a black circle represents a MOSFET with a gate input $\overline{A}_i$ which is the negative signal of $A_i$.

There are four rows of MOSFETs. Input signal $A_i/\overline{A}_i$ represents a two-value input, causing a MOSFET of either a white circle or a black circle to become On. In other words, when a path from either $Q_1$ or $Q_2$ to the source $V_{SS}$ is considered, passage is possible from each node to $V_{SS}$ only through the MOSFET in ON condition corresponding to the input level of $A_i/\overline{A}_i$ of the white and black circles.

The number of MOSFETs in ON condition between $Q_1$ and node $P_1$ or between $Q_2$ and node $P_2$ is always $n-1$ of which the number of MOSFETs represented by black circles is even. In summary, the number of black circles which are passed between $Q_1$ and $V_{SS}$ and between $Q_2$ and $V_{SS}$ are respectively even and odd. If output is defined as "0" when the two levels of $A_i$ and $\overline{A}_i$ are made to correspond to logical "1" and "0" so that white and black circles become ON while $A_i = 1$ and 0, respectively, and a current path is formed from output points $Q_1$ and $Q_2$ to the power source $V_{SS}$, FIG. 3 shows that output point $Q_1$ becomes "0" when an even number of the n inputs are "0" while output point $Q_2$ becomes "0" when an odd number of the n inputs are "0". If the total number of inputs is even, output $Q_1$ becomes the n-input EXCLUSIVE-OR while output $Q_2$ becomes its negative. If the total number of inputs is odd, the results are reversed, output $Q_2$ becoming the n-input EXCLUSIVE-OR and output $Q_1$ becoming its negative output.

The circuit described above can be constructed by using complementary MOSFETs. Both n-channel MOSFETs and p-channel MOSFETs are used. Between the two power source lines, the p-channel MOSFETs are placed on the side of the higher voltage and the output points $Q_1$ and $Q_2$ are connected together. When an n-channel MOSFET and a p-channel MOSFET are on the same input level, one of them becomes ON and the other OFF. Thus, when output point $Q_1$ is connected to one of the power source lines, output point $Q_2$ comes to be in conductive relationship with the other power source line. This means that outputs $Q_1$ and $Q_2$ are found on two different levels. Furthermore, there is no current path at all between the two power sources.

In summary, the present invention allows the EXCLUSIVE-OR output and its negation from a large number of inputs to be obtained by a MOSFET circuit with an extremely small number of elements. The time of operation for retrieving the output can also be reduced. According to the present invention, there is hardly any difference in time of operation between circuits for EXCLUSIVE-OR and its negation. This makes circuit designs easier in relation to neighboring circuits. The present invention can be utilized not only for an EXCLUSIVE-OR circuit but also for parity test in the case of many inputs by making two-stage and three-stage connections.

What is claim is:

1. A MOSFET circuit comprising four MOSFET rows consisting of a first row, a second row, a third row and a fourth row which are sequentially arranged, each row containing a same number n of MOSFETs connected in series between first and second row ends, and respectively sequentially numbered from 1 to n, n being greater than 2, said first row and said second row being connected at one of said first and second row ends to form a first output point, said third row and said fourth row being connected at one of said first and second row ends to form a second output point, a first set of gate input signals being for application individually to MOSFETs in said first and third rows, a second set of gate input signals which are respectively the logical inverse of said first set of gate input signals being for application individually and in same sequence to MOSFETs in said second and fourth rows, the jth (j=2 ... n) MOSFET in said first row, said second row, said third row and said fourth row connecting to the (j-1)st MOSFETs in said first and fourth rows, said second and third rows, said third and second rows and said fourth and first rows, respectively if j is even, the jth (j=2 ... n) MOSFET in said first row, said second row, said third row and said fourth row connecting to the (j-1)st MOSFETs in said first and second rows, said second and first rows, said third and fourth rows and said fourth and third rows, respectively if j is odd, the other of said first and said second row ends being connected to a power line through two end MOSFETs, gate inputs to said two end MOSFETS being logical inverse with respect to each other.

2. A MOSFET circuit comprising four MOSFET rows consisting of a first row, a second row, a third row and a fourth row which are sequentially arranged, each row containing a same number n of MOSFETs connected in series between first and second row ends, and respectively sequentially numbered from 1 to n, n being greater than 2, said first row and said second row being connected at one of said first and second row ends to form a first output point, said third row and said fourth row being connected at one of said first and second row ends to form a second output point, a first set of gate input signals being for application individually to MOSFETs in said first and third rows, a second set of gate input signals which are respectively the logical inverse of said first set of gate input signals being for application individually and in same sequence to MOSFETs in said second and fourth rows, the jth (j=2 ... n) MOSFET in said first row, said second row, said third row and said fourth row connecting to the (j-1)st MOSFETs in said first and fourth rows, said second and third rows, said third and second rows and said fourth and first rows, respectively if j is even, the jth (j=2 ... n) MOSFET in said first row, said second row, said third row and said fourth row connecting to the (j-1)st MOSFETs in said first and second rows, said second and first rows, said third and fourth rows and said fourth and third rows, respectively if j is odd, the other of said first and said second row ends being connected to a power line through two end MOSFETs, gate inputs to said two end MOSFETs being logical inverse with respect to each other, said two end MOSFETs consisting of a first end MOSFET connected to said first and fourth rows and a second end MOSFET connected to said second and third rows.

3. A MOSFET circuit comprising four MOSFET rows consisting of a first row, a second row, a third row and a fourth row which are sequentially arranged, each row containing a same number n of MOSFETs connected in series between first and second row ends, and respectively sequentially numbered from 1 to n, n being greater than 2, said first row and said second row being connected at one of said first and second row ends to form a first output point, said third row and said fourth row being connected at one of said first and second row ends to form a second output point, a first set of gate input signals being for application individually to MOSFETs in said first and third rows, a second set of gate input signals which are respectively the logical inverse of said first set of gate input signals being for application individually and in same sequence to MOSFETs in said second and fourth rows, the jth (j=2 ... n) MOSFET in said first row, said second row, said third row and said fourth row connecting to the (j-1)st MOSFETs in said first and fourth rows, said second and third rows, said third and second rows and said fourth and first rows, respectively if j is even, the jth (j=2 ... n) MOSFET in said first row, said second row, said third row and said fourth row connecting to the (j-1)st MOSFETs in said first and second rows, said second and first rows, said third and fourth rows and said fourth and third rows, respectively if j is odd, the other of said first and said second row ends being connected to a power line through four end MOSFETs, said four end MOSFETs consisting of a first end MOSFET connected to said first row, a second end MOSFET connected to said second row, a third end MOSFET connected to said third row and a fourth end MOSFET connected to said fourth row, gate input signals to said first and third end MOSFETs being logical inverse with respect to gate input signals to said second and fourth end MOSFETs.

* * * * *